(12) United States Patent
Hu et al.

(10) Patent No.: US 9,423,535 B1
(45) Date of Patent: Aug. 23, 2016

(54) LED DISPLAY SCREEN COVERS AND LED DISPLAYS

(71) Applicant: Beijing Universal Lanbo Technology Co., Ltd, Beijing (CN)

(72) Inventors: Didi Hu, Beijing (CN); Donglin Pi, Beijing (CN)

(73) Assignee: Beijing Universal Lanbo Technology Co., Ltd., Beijing (CN)

( * ) Notice: Subject to any disclaimer, the term of this patent is extended or adjusted under 35 U.S.C. 154(b) by 0 days.

(21) Appl. No.: 15/043,069

(22) Filed: Feb. 12, 2016

Related U.S. Application Data

(63) Continuation-in-part of application No. PCT/CN2015/084447, filed on Jul. 20, 2015.

(30) Foreign Application Priority Data

Feb. 15, 2015 (CN) .......................... 2015 1 0080390

(51) Int. Cl.
| | |
|---|---|
| *H01J 5/16* | (2006.01) |
| *H01J 61/40* | (2006.01) |
| *H01K 1/26* | (2006.01) |
| *H01K 1/30* | (2006.01) |
| *H05B 33/02* | (2006.01) |
| *G02B 5/02* | (2006.01) |
| *H05B 33/12* | (2006.01) |

(52) U.S. Cl.
CPC ........... *G02B 5/0242* (2013.01); *G02B 5/0278* (2013.01); *H05B 33/12* (2013.01)

(58) Field of Classification Search
CPC ... G02B 5/0242; G02B 5/0278; H05B 33/12
See application file for complete search history.

(56) References Cited

U.S. PATENT DOCUMENTS

| | | | |
|---|---|---|---|
| 5,667,289 A | 9/1997 | Akahane et al. | |
| 5,836,674 A * | 11/1998 | Nishitani | ............ F21S 48/2212 362/244 |
| 5,931,555 A | 8/1999 | Akahane et al. | |
| 6,502,956 B1 * | 1/2003 | Wu | ......... F21V 14/06 257/E25.028 |
| 8,444,296 B2 * | 5/2013 | Park | ....... G02B 6/003 362/224 |

(Continued)

FOREIGN PATENT DOCUMENTS

| | | |
|---|---|---|
| CN | 201100902 Y | 8/2008 |
| CN | 201129705 Y | 10/2008 |

(Continued)

OTHER PUBLICATIONS

International Search Report for Application No. PCT/CN2015/08444 dated Nov. 19, 2015, 13 pages.

(Continued)

*Primary Examiner* — Donald Raleigh
(74) *Attorney, Agent, or Firm* — Fish & Richardson P.C.

(57) ABSTRACT

An LED display screen cover includes a screen cover body including a plurality of cover units disposed in an array of multiple rows and multiple columns, each cover unit configured to be positioned on top of a respective LED lamp of an array of LED pixel units of an LED screen. A top of each cover unit forms an arched structure extending away from the LED pixel lamp, the arched structures of adjacent cover units configured and joined along the columns and rows such that, when placed over an illuminated LED screen, no perceptible light gaps are visible between adjacent screen pixels, as viewed through the screen cover body.

20 Claims, 13 Drawing Sheets

(56) References Cited

U.S. PATENT DOCUMENTS

| | | | |
|---|---|---|---|
| 8,506,131 B2 | 8/2013 | Fluhrer | |
| 8,919,980 B2 | 12/2014 | Lin | |
| 8,963,810 B2 | 2/2015 | Li et al. | |
| 8,963,811 B2 | 2/2015 | Li et al. | |
| 9,157,607 B2 | 10/2015 | Wang et al. | |
| 9,212,803 B2* | 12/2015 | Auyeung | F21S 6/006 |
| 9,217,822 B2 | 12/2015 | Griffin et al. | |
| 2002/0026734 A1* | 3/2002 | Bayrle | G09G 3/36 40/448 |
| 2003/0147255 A1* | 8/2003 | Im | G02B 27/18 362/558 |
| 2009/0091919 A1* | 4/2009 | Goto | G02F 1/133606 362/97.1 |
| 2009/0116219 A1* | 5/2009 | Chang | G02B 5/0215 362/97.1 |
| 2009/0256994 A1* | 10/2009 | Kamada | G02B 5/0278 349/61 |
| 2010/0165663 A1* | 7/2010 | Chang | G02B 5/0215 362/625 |
| 2010/0220461 A1* | 9/2010 | Naijo | G02F 1/133603 362/97.1 |
| 2011/0057215 A1* | 3/2011 | Chen | G09F 7/002 257/98 |
| 2011/0065480 A1* | 3/2011 | Kim | H04N 13/0406 455/566 |
| 2013/0301235 A1* | 11/2013 | Harooni | G03B 15/02 362/11 |
| 2014/0071417 A1* | 3/2014 | Grespan | B32B 38/0008 355/67 |
| 2014/0133160 A1 | 5/2014 | Hong et al. | |
| 2014/0293649 A1* | 10/2014 | Iyoda | F21S 48/00 362/611 |

FOREIGN PATENT DOCUMENTS

| | | |
|---|---|---|
| CN | 201417579 Y | 3/2010 |
| CN | 202075944 U | 12/2011 |
| CN | 103354066 A | 10/2013 |
| CN | 203787041 U | 8/2014 |
| EP | 2398009 A2 | 12/2011 |
| KR | 2011133736 A | 12/2011 |
| WO | WO2014164792 A1 | 10/2014 |
| WO | WO2015079539 A1 | 6/2015 |
| WO | WO2016019395 A1 | 2/2016 |

OTHER PUBLICATIONS

Pantoja Conde, European Search Report for European Patent Application No. EP 16155660.0, Jun. 10, 2016, 8 pages.

* cited by examiner

LED DISPLAY SCREEN COVERS AND LED DISPLAYS

CROSS-REFERENCE TO RELATED APPLICATIONS

This application claims priority under 35 U.S.C. §120 to PCT Application No. PCT/CN2015/084447 filed on Jul. 20, 2015 and under 35 U.S.C. §119 to Chinese Patent Application No. CN 201510080390.2 filed on Feb. 15, 2015. The contents of both of these priority applications are hereby incorporated by reference in their entirety.

TECHNICAL FIELD

The disclosure relates to optical structures, particularly to LED display screen covers and LED displays.

BACKGROUND

Compared to a conventional picture tube display and a liquid crystal display, a light emitting diode (abbreviated as "LED") display possesses relatively outstanding advantages, and one can carry out connection with any resolution ratio and can realize a wireless connection with it, and thereby satisfy the requirements for display dimensions and resolving rate in different scenes.

A plurality of LED lamps that are provided in the LED display are arranged to form an array, and one LED lamp forms one LED pixel unit. Since light-emission area of the LED lamp is smaller than the physical surface area occupied by the LED pixel unit, its filling coefficient is relatively small, and this results in clear black areas present in spaces between adjacent LED pixel units, which is manifested as a periodic black area grid structures on the entire display. Since the majority of image acquisition devices of current photographic equipment are charge-coupled devices (abbreviated as "CCD"), they similarly are provided with a periodic structure, and therefore when the photographic equipment captures the LED display, and the spatial frequency whose image is formed by the LED display on the CCD is close to the spatial frequency of the CCD, clear moire fringes appears, which affects the definition of the image. Moreover, when the filling coefficient of the LED pixel unit is relatively small, this will cause graininess and lower the degree of viewing comfort. At the same time, in order to guarantee the overall brightness, the brightness of the light issued by the LED lamp is universally rather great, but owing to the fact that the light-emitting region is small it easily causes glare, and it is not possible for viewers to watch it for a long time.

SUMMARY

One aspect of the invention features a screen cover including a screen cover body including a plurality of cover units disposed in an array of multiple rows and multiple columns, each cover unit configured to be positioned over a respective LED lamp of an array of LED pixel units of an LED screen. A top of each cover unit forms an arched structure extending away from the LED lamp, and the arched structures of adjacent cover units are configured and joined along the columns and rows so as to provide the screen cover with a filling coefficient of more than 93%.

In some implementations, each cover unit includes a light blocking part configured to block off light from adjacent LED pixel units and a scattering part installed on top of the light blocking part and forming the top of the cover unit. An outer surface of the scattering part can be spherical. In a particular example, a spherical radius of the outer surface of the scattering part is within a range of $\sqrt{2}a/2$~$0.9a$, where a is a period of the LED pixel units.

In some implementations, an inner surface of each cover unit is positioned so as to form a gap between the inner surface and an upper surface of the LED lamp. The inner surface can be arched away from the LED lamp. The inner surface can be spherical. In a particular example, an outer surface of the scattering part is spherical, and the inner surface has a radius r determined by:

$$r \geq \sqrt{R^2 - ab + \frac{1}{2}b^2}$$

where R is a radius of the outer surface, a is a period of the LED pixel units, and b is an edge length of the LED lamp.

In some examples, a transitional circular arc is formed between the spherical inner surface and an adjacent inner wall of the screen cover. A radius of the transitional circular arc can be within a range of 0.08 a-0.2 a, where a is a period of the LED pixel units.

The screen cover body can have a haze of no less than 50%. The screen cover can include a material having an RGB color ratio of about (1±0.2):(1±0.2):(1±0.2).

Another aspect of the invention features a screen cover has a screen cover body including a plurality of cover units disposed in an array of multiple rows and multiple columns, each cover unit configured to be positioned on top of a respective LED lamp of an array of LED pixel units of an LED screen. A top of each cover unit forms an arched structure extending away from the LED pixel lamp, the arched structures of adjacent cover units being configured and joined along the columns and rows such that, when placed over an illuminated LED screen, no perceptible light gaps are visible between adjacent screen pixels, as viewed through the screen cover body. The screen cover is configured to have a filling coefficient of more than 93%.

In some implementations, each cover unit includes a light blocking part configured to block off light from adjacent LED pixel units and a scattering part installed on top of the light blocking part and forming the top of the cover unit. An inner surface of the scattering part can be a spherical surface, and a transitional circular arc can be provided between the inner surface and an inner wall of the light blocking part.

A further aspect of the invention features an LED display screen cover including a screen cover body including a plurality of cover units disposed in an array of multiple rows and multiple columns, each cover unit configured to be positioned on top of a respective LED pixel lamp and including a blocking part and a scattering part on top of the blocking part. An outer surface of the scattering art has an arched structure towards a direction away from the LED pixel lamp, and the arched structures of scattering parts of adjacent cover units are configured joined along the columns and rows, and a material of the blocking part is selected such that the blocking part is configured to block off light from adjacent LED pixel lamps. The arched structures of the adjacent cover units can be configured so as to provide the LED display screen cover with a filling coefficient of more than 93%.

In some implementations, the LED display screen cover is arranged over an array of LED pixel lamps such that each cover unit is disposed over a respective one of the LED pixel lamps, the cover units of the screen cover together configured such that, with the LED pixel lamps illuminated, there is no perceptible light gap between adjacent pixel units, as viewed through the screen cover.

A fourth aspect of the invention features an LED display including an LED display screen body of an array of LED pixel units each having a respective LED lamp and an LED display screen cover coupled to the LED display screen body and including a plurality of cover units disposed in an array of multiple rows and multiple columns, each cover unit configured to be positioned on top of a respective LED lamp. A number of the cover units in the LED display screen cover is the same as a number of the LED lamps in the LED display screen body, and a top of each cover unit has an arched structure towards a direction away from the respective LED lamp, and the arched structures of adjacent cover units are configured and joined along the columns and rows so as to provide the screen cover with a filling coefficient of more than 93%.

A fifth aspect of the invention features a covered LED screen including an array of LED pixel units arranged in multiple rows and multiple columns and a screen cover body with an array of LED cover units disposed in multiple rows and multiple columns, each cover unit configured to be positioned over an LED lamp of a respective one of the LED pixel units. An outer surface of each cover unit is convex, the outer surfaces of adjacent cover units being configured and joined along the columns and rows, and each cover unit has an inner surface spaced from an outer surface of an underlying LED lamp to form a gap.

The inner surface of each cover unit can be concave. Each concave inner surface can transition to adjacent side walls of a cavity of the cover unit containing the respective LED lamp by a transitional radius.

A sixth aspect of the invention features a device for eliminating moire fringes from an LED screen and improving the filling coefficient. The device includes a scattering cover and an LED screen body. The above-described scattering cover covers the front end of the LED screen body, and the scattering cover is fixedly connected with the LED screen body; and the size of the above-described scattering cover mutually corresponds to the size of the LED screen body; the front side of the above-described scattering cover is formed by an array of ball top structures, and the back side of the above-described scattering cover defines an array of cavities corresponding to the ball top structures. The device also includes a plurality of LED pixel lamps provided on the above-described LED screen body, each LED pixel lamp extending into a corresponding one of the cavities. The scattering cover can be configured to provide the LED screen with a filling coefficient of more than 93%, when viewed through the scattering cover.

A seventh aspect of the invention features a device for eliminating moire fringes from an LED screen and improving the filling coefficient. The device is primarily composed of a scattering cover and an LED screen body. The above-described scattering cover covers a front end of the LED screen body, and the scattering cover is fixedly connected with the LED screen body; and a size of the above-described scattering cover mutually corresponds to a size of the LED screen body; the front side of the above-described scattering cover is provided with a plurality of ball top structures, and a back side of the above-described scattering cover is an independent groove provided with partition structures or does not have any structures. The device also includes a plurality of LED pixel lamps provided on the above-described LED screen body. The above-described LED pixel lamps mutually correspond to the ball top structures, and the above-described scattering cover is provided with a haze that is not lower than 70%.

The above-described scattering cover can include a variety of spherical structures: positive ball top solid bodies or shells, oval ball top solid bodies or shells, and structures where several flat surfaces are joined to form quasi-ball top structures or structures whose surfaces are uneven. The above-described positive ball top structures can be determined based on pixel dimensions of the LED pixel lamp and a haze of the scattering cover: if the pixel side length of an LED pixel lamp is a, then a ball top radius r of the ball top structures is $(\sqrt{2}/2)a{\sim}0.9a$; the ball center of the ball top structures is located at a position that has the same length difference as the radius from the pixel apex angle of the upper surface of the LED pixel lamp to the center normal line of the LED pixel lamp. The above-described ball top radius r can be selected based on a light emission position and light emission scattering angle distribution of the LED pixel lamps and a haze of the scattering cover.

In some implementations, the above-described partition structures are independent grooves that are produced according to a cycle of the LED pixel lamps. The above-described grooves can be rectangular structures, and the length, width and depth of those rectangular structures can be similar to the length, width and depth of the sealed structures of the LED pixel lamp. The bottom part of the above-described grooves can be spherical arc-shaped depression structures, and a radius of the arc-shaped depression structures can be determined by a haze of a selected material of the LED screen cover. The radius of the arc-shaped depression structures is at a maximum not smaller than the radius r of the ball top structures, and the depression depth is in a range of 0 to 0.5 mm.

There can be two implementation methods for connecting the above-described scattering cover and the LED screen body: a fixed connection with a fixing pin on the scattering body or a fixed connection by direct bonding on the surface of the LED screen by glue on the back side.

An eighth aspect of the invention features a method using a device for eliminating moire fringes from an LED screen and improving a filling coefficient described in the seventh aspect. The device for eliminating moire fringes from an LED screen and improving the filling coefficient described in any one of the above features is used. The method includes the following steps:

1) production of the scattering cover: a light-permeable material that is provided with a haze of no less than 70% is employed to produce the scattering cover;

2) LED screen production;

3) installation: fixed installation employing a fixing pin: the scattering cover whose injection molding is completed in step 1) covers the front end of the LED screen body, the fixing pins pass through the through holes on the printed circuit board (PCB); the fixing pins that are passed through the back side of the PCB are heated to make them melt, and after they cool they are remolded, that is, the scattering cover is fixedly installed on the LED screen body; or installation employing bonding with glue: glue is directly applied to the back side of the scattering body or on the partition structures, and directly bonded on the surface of the LED screen body.

A ninth aspect of the invention features an LED display screen cover including a screen cover main body. There is provided a plurality of lamp cover units forming an array on the above-described screen cover main body, and each lamp cover unit is used for covering above a respective LED lamp. A top of the described lamp cover unit is an arch structure that faces in a direction away from the LED lamp.

In some implementations, the above-described lamp cover unit includes a light partitioning part that partitions off a space between neighboring LED lamps, and a scattering part that is installed on a top of the above-described light partitioning part. The above-described scattering part is the top of the above-described lamp cover unit. The outer surface of the above-described scattering part can be a positive spherical surface. A haze of the above-described scattering part can be greater than or equal to 50%.

In some implementations, a gap used for light diffusion is provided in a space between an inner surface of the above-described scattering part and an upper surface of the LED lamp. The inner surface of the above-described scattering part has an arched structure facing towards a direction away from the LED lamp. The inner surface of the above-described scattering part can be an arc surface.

In some examples, a transitional circular arc is provided between the inner surface of the scattering part corresponding to an apex angle of the above-described LED lamp and the inner wall of the light partitioning part. The radius of the above-described transitional circular arc can be 0.08 a-0.2 a, where a is the period of the LED pixel unit.

The spherical radius of the outer surface of the above-described scattering part can be $\sqrt{2}a/2$~$0.9a$, where a is a period of the LED pixel unit. The arc surface radius r of the inner surface of the above-described scattering part can be obtained by calculating with the following equation:

$$r \geq \sqrt{R^2 - ab + \frac{1}{2}b^2}$$

where R is the spherical radius of the outer surface of the scattering part, a is the period of the LED pixel unit, and b is the edge length of the LED lamp.

A tenth aspect of the invention features an LED display including a screen body of an LED lamp array and the LED display screen cover described in any one of the ninth aspect that is connected with the above-described screen body. The quantity of the lamp cover units in the above-described LED display screen cover is the same quantity as the LED lamps.

Particular embodiments of the subject matter described in this specification can be implemented so as to realize one or more of the following advantages. Owing to the facts that a plurality of lamp cover units forming an array are installed on a screen cover main body, that each lamp cover unit is provided above one LED pixel unit, and that a top part of each lamp cover unit is installed as an arched structure that faces in a direction away from the LED pixel unit, the light rays emitted by an LED pixel unit can propagate from its own lamp cover unit, and the screen cover will not cause interference for adjacent pixel units, and this guarantees a definition of an image displayed by the LED screen. In addition, there are no black areas present in a space between two adjacent LED pixel units, and thus the screen cover will not generate periodic black area grid structures for the entire LED display screen, and makes the space between pixel units "zero distance", which effectively eliminates moire fringes during screen capture; at the same time, the screen cover improves the pixel filling coefficient, e.g., higher than 93%, and eliminates incoherence and "graininess" of the screen under conditions where sharpness and definition of the image are ensured. The arched structures of the screen cover make light scattering uniform. When a viewer views the LED display screen from a large inclined angle, the brightness decay is not significant. Three primary colors (e.g., red, green, and blue) in a single pixel can be mixed evenly in the scattering cover, which causes a softer viewing effect than a conventional separated three primary colors on an LED lamp. At the same time, the scattering cover reduces the overall brightness of the LED screen, reduces the light contamination that might be produced, and prevents damage caused to the viewer's eyes due to excessive brightness.

Further advantages and advantageous embodiments of the subject of the invention can be seen from the description, the claims and the drawing. The above-mentioned features, as well as the further features listed below, can likewise be used independently or multiple features combined as desired. The embodiments shown and described are not to be understood as a conclusive list, but should rather be treated as examples to illustrate the invention. The figures in the drawing show the subject in accordance with the invention in a highly schematic way, and are not to be understood as being drawn to scale.

BRIEF DESCRIPTIONS OF DRAWINGS

DETAILED DESCRIPTION

Implementations of the present disclosure are generally directed to an LED display screen cover. The LED display screen cover is installed on a surface of a screen body of an LED display screen, and can provide no perceptible light gap between adjacent LED pixels, which can effectively eliminate periodic black area grid structures of the LED display. In some implementations, the LED display screen cover enables that eliminating moire fringes from the LED display screen and improving the filling coefficient to be higher than 93% are simultaneously achieved. In addition, independence of LED pixels is ensured, mutual interference between the LED pixels can be avoided, and sharpness and definition of images displayed by the LED display is ensured.

Figure 22:
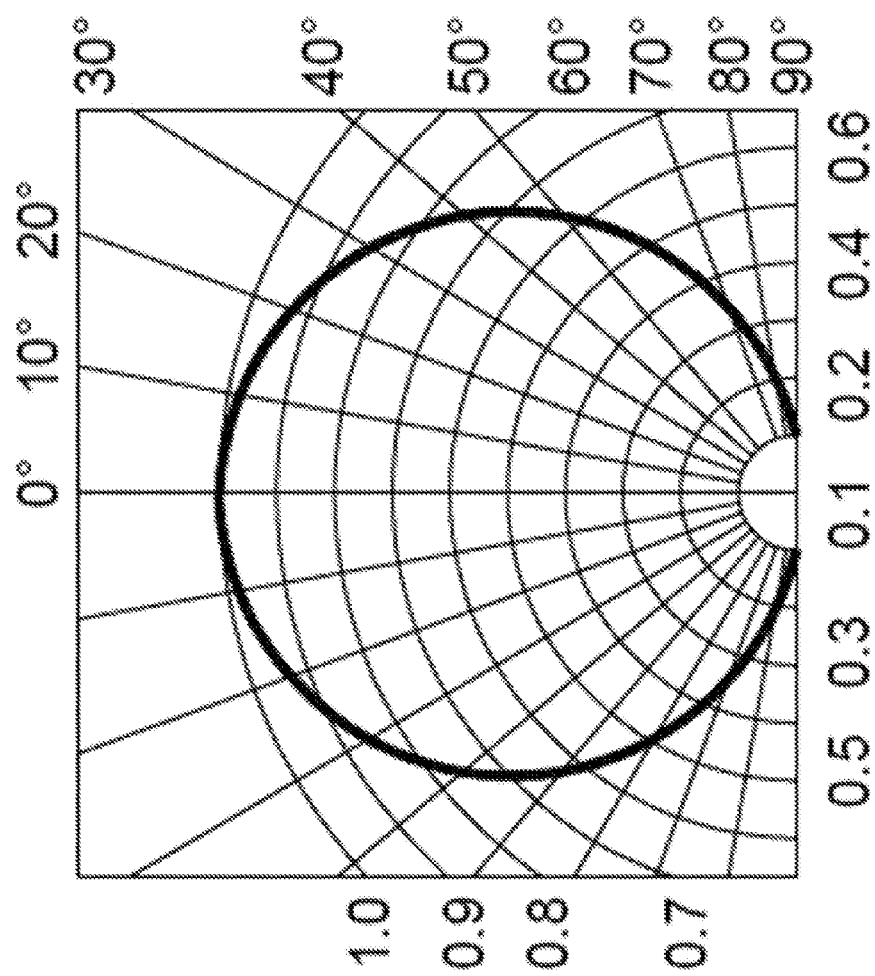
FIG. 22 is a structural diagram of an example LED lamp scattering angle.
Figure 23:
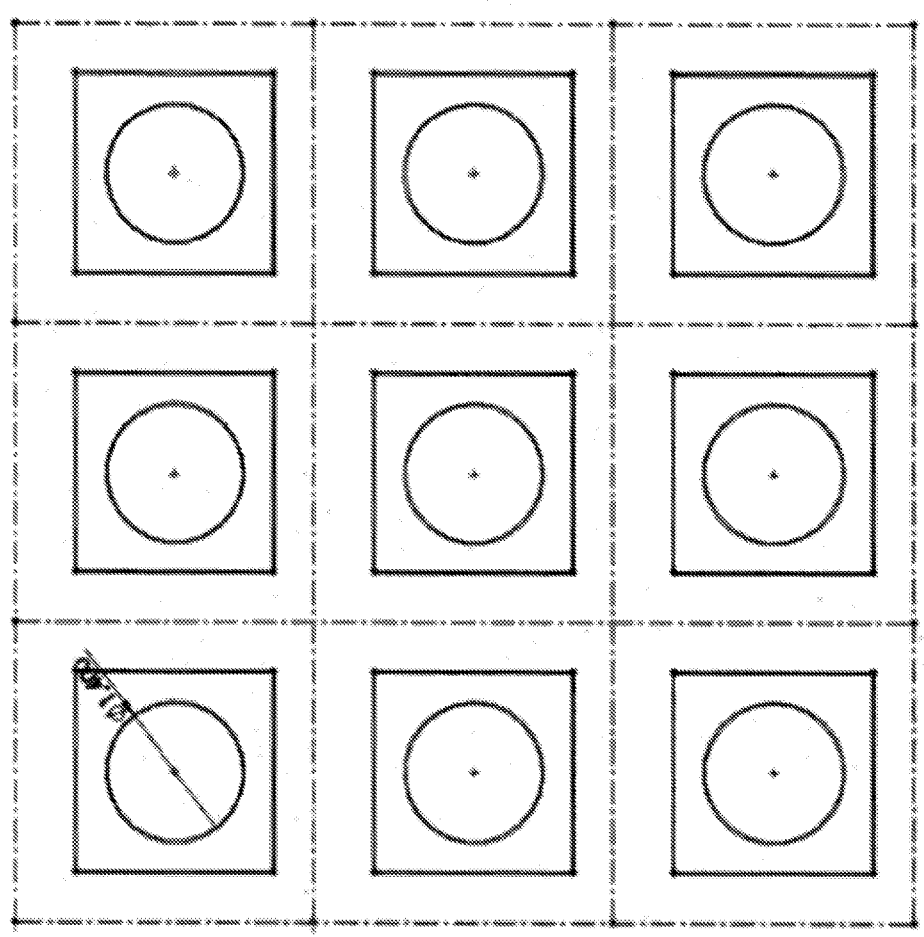
FIG. 23 is a schematic diagram showing a filling coefficient of an LED display.

The filling coefficient is defined as a ratio between a light-emitting area in a single pixel and a pixel physical surface area. For example, FIG. 22 shows an example distribution of an LED lamp light scattering angle. FIG. 23 shows an LED display screen including nine pixel units. A small square with dotted lines is a single pixel physical surface, whose dimensions are 3 mm×3 mm. A square with solid lines is an LED lamp package edge, and a circle is an LED light-emitting region, whose radius is 0.7 mm. Thus, the filling coefficient of the LED screen is $(\pi \times 0.7^2/(3\times 3))\times 100\% = 17.1\%$. A relatively smaller filling coefficient results in the screen being incoherent and incomplete when viewed from a relatively close distance, and the unevenness of the brightness causes graininess and relatively serious glare, while the screen with a larger filling coefficient can eliminate "graininess" and make the screen softer, and does not possess clear brightness decay when viewing with a large inclined angle.

Figure 1:
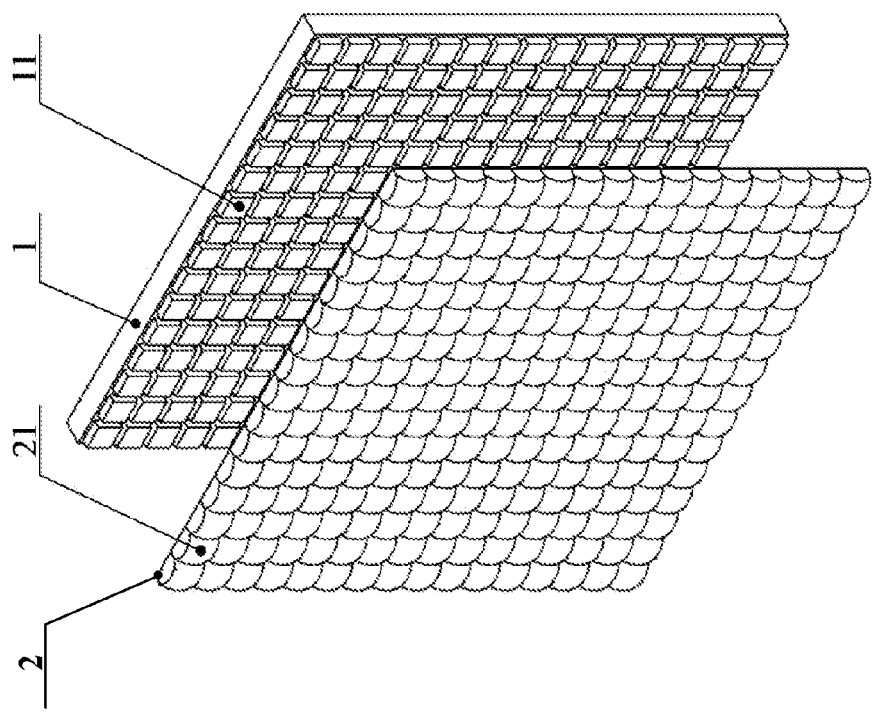
FIG. 1 is a schematic diagram of an example assembly of an LED display screen cover and an LED display screen body.

FIG. 1 is a schematic diagram of an assembled structure of an LED display screen body 1 of an LED display and an LED display screen cover 2 according to an example embodiment. The screen body 1 of the LED display is provided with a PCB circuit board, and there is a plurality of LED lamps 11 welded on the PCB circuit board, and each LED lamp 11 forms one LED pixel unit. A plurality of LED lamps 11 form an array structure. The screen body 1 is connected with the LED display screen cover 2, and the LED display screen cover 2 includes a screen cover main body and a plurality of lamp cover units 21 forming an array of multiple rows and multiple columns provided on the screen cover main body. Each lamp cover unit 21 is positioned on top of about a respective LED pixel lamp 11 and used for covering the LED pixel lamp 11. The screen cover main body can be bonded together with the screen body 1 (e.g., by glue bonding), connected by employing a bolt, connected by clamping with a fastener, or connected with pins.

Figure 2:
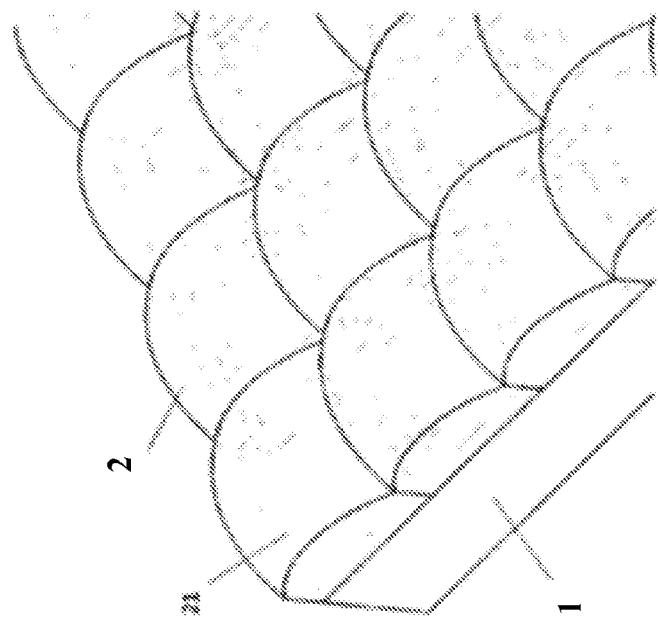
FIG. 2 is a schematic diagram of a locally enlarged structure of the assembly of the LED display screen cover with the LED screen body.
Figure 3:
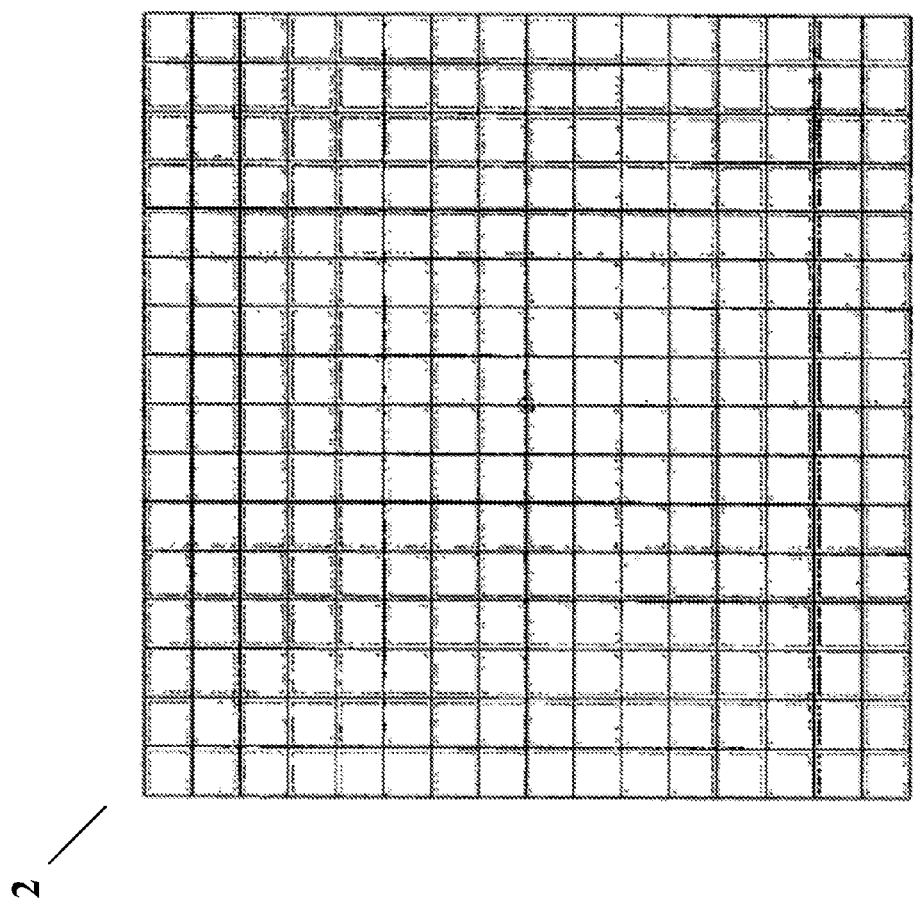
FIG. 3 is a schematic diagram of a frontal view of the LED display screen cover.
Figure 5:
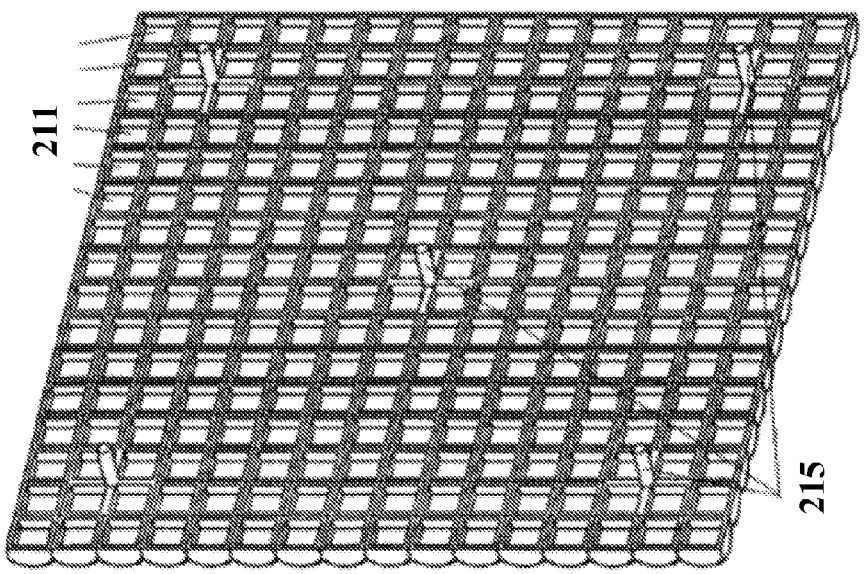
FIG. 5 is a schematic diagram of an example structure of a back side of the LED display screen cover.
Figure 4:
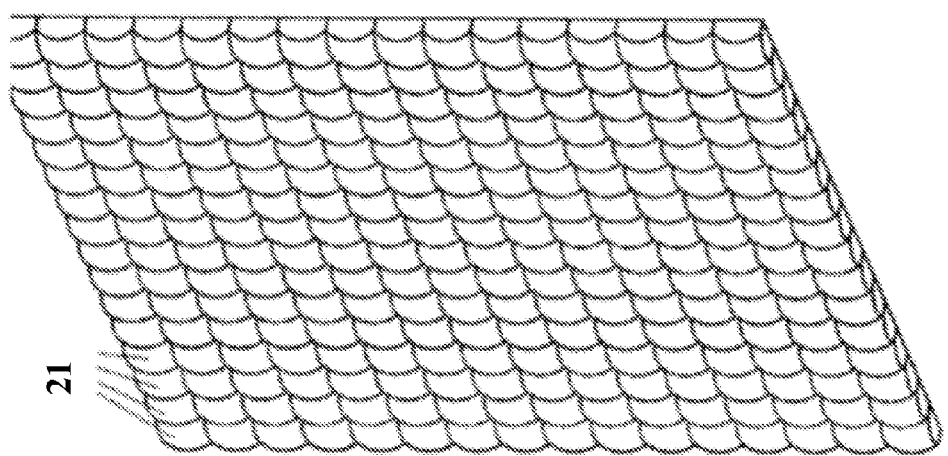
FIG. 4 is a schematic diagram of an example structure of a front side of the LED display screen cover.

FIG. 2 is a schematic diagram of the locally enlarged structure of the assembly of the LED display screen cover 2 with the LED screen body 1. The screen cover 2 includes a plurality of cover units 21 and is positioned on top of the LED screen body 1. FIG. 3 is a schematic diagram of a frontal view of the LED display screen cover 2. FIG. 4 is a schematic diagram of an example structure of a front side of the LED display screen cover 2. The cover units 21 are joined together along the rows and columns to form a two-dimensional screen cover 2. FIG. 5 is a schematic diagram of an example structure of a back side of the LED display screen cover 2. As discussed below, the screen cover 2 includes a light blocking part 211. One or more fixing pins 215 can be set up on the surface of the back side for fixing the screen cover 2 and the screen body 1 with the PCB circuit board.

Figure 7:
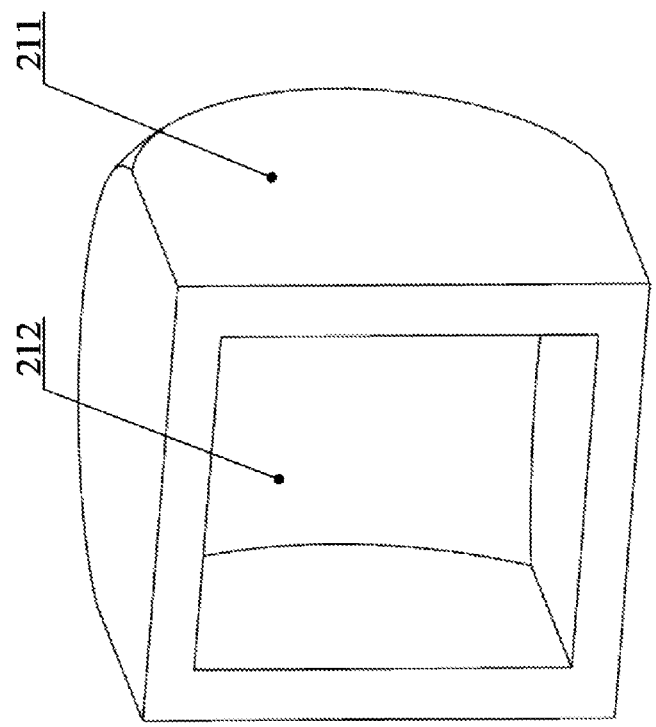
FIG. 7 is a schematic diagram of another view of the lamp cover unit in the LED display screen cover.
Figure 6:
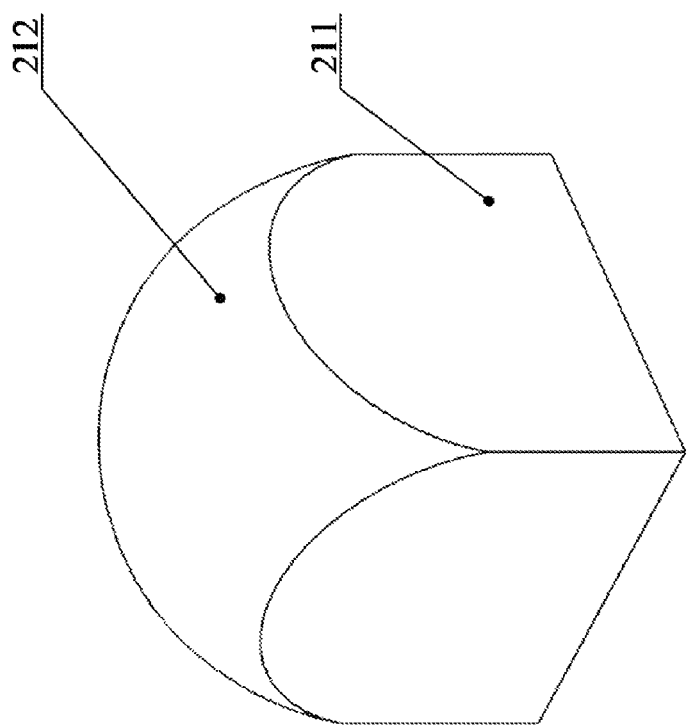
FIG. 6 is a schematic diagram of an example structure of a lamp cover unit in the LED display screen cover.

Each lamp cover unit 21 can have a same structure. FIG. 6 is a schematic diagram of an example structure of the lamp cover unit 21 in the LED display screen cover 2, and FIG. 7 is a schematic diagram of another angle of the lamp cover unit 21 in the LED display screen cover 2. As shown in FIGS. 6 and 7, a top part of the lamp cover unit 21 has an arched structure facing away from the LED lamp 11.

The structure of the lamp cover unit 21 can be implemented in different ways. In some implementations, as FIGS. 6 and 7 show, the lamp cover unit 21 includes a light blocking part 211 that blocks off light from adjacent LED lamps 11 and a scattering part 212 installed on the top part of the light blocking part 211. The outer surface of the scattering part 212 is an arch facing towards a direction away from the LED lamp 11. The light blocking part 211 and the scattering part 212 can be formed integrally or be bonded together.

In some examples, a sealed (e.g., packaged or assembled) structure of the LED lamp 11 is cuboid, and an inner wall of the light blocking part 211 surrounds the cuboid structure and accommodates the LED lamp 11. In order to adapt to the structure of the adjacent LED lamps 11, outer walls on the four side surfaces of the light blocking part 211 can be planes. Two adjacent lamp cover units 21 can be joined by putting the outer walls of the light blocking parts 211 together. Alternatively, the light blocking parts 211 of two adjacent lamp cover units 21 can be an integral structure.

As for the arched structure in which the scattering part 212 faces in a direction away from the LED lamp 11, an intersection line of two adjacent scattering parts 212 is coplanar with the outer wall of the light blocking part 211, and said plane is perpendicular to the surface of the LED lamp 11 provided in the screen body 1. In a situation where the light blocking part 211 in two adjacent lamp cover units 21 is an integral structure, the intersection line of the two adjacent scattering parts 212 is located between the light blocking part 211.

Figure 8:
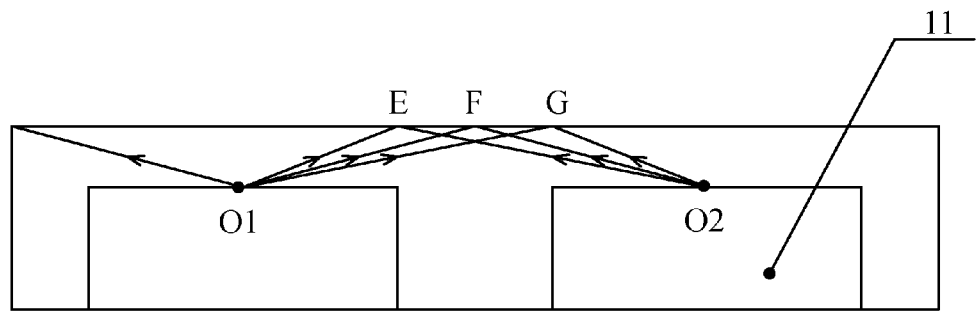
FIG. 8 is an example light path schematic diagram in which a scattering glass is fitted to an LED lamp.

FIG. 8 is a light path schematic diagram in which a scattering glass is fitted to an LED lamp. A piece of scattering glass is provided as a cover on two LED lamps 11. The scattering glass has a back plane that faces towards an inner surface of the LED lamps 11 and a front plane that faces away from an outer surface of the LED lamps. Light-emitting points of the two LED lamps 11 are O1 and O2, respectively. In light rays emitted from the light-emitting point O1, the light rays O1E, O1F and O1G that are emitted towards the center of the two LED lamps 11 on the left and right respectively coincide on the projection points E, F and G on the scattering glass with the light rays O2E, O2F and O2G that are emitted from light-emitting point O2. Therefore, the two light rays that are respectively located at each projection point position interfere with each other, and this results in an image at the projection point being relatively indistinct, which in turn results in the edges of the LED pixel units being relatively indistinct. The scattering glass includes a scattering film (or layer) on its surface to cause light scattering, however, due to restrictions of scattering film technology, the scattering angle of the scattering glass is not large, and the screen brightness rapidly decays along with an increase of the viewing angle.

Figure 9:
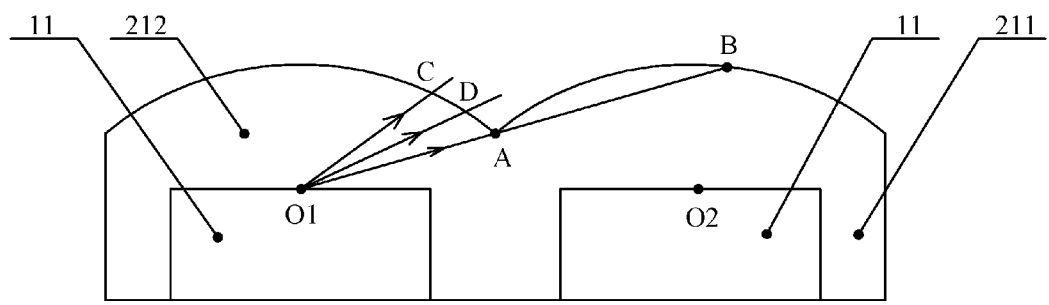
FIG. 9 is an example light path schematic diagram in which the LED display screen cover is fitted to an LED lamp.

FIG. 9 is a light path schematic diagram in which the LED display screen cover 2 is fitted to an LED lamp 11. The lamp cover unit 21 is provided above the LED lamp 11, and the light rays emitted by the LED lamp 11 exhibit a dispersed state and are emitted towards the lamp cover unit 21. FIG. 9 shows two left and right adjacent LED lamps 11, and one lamp cover unit 21 is provided as a cover above each LED lamp 11. The light-emitting points of the two left and right LED lamps are O1 and O2, respectively. Taking light-emitting point O1 as an example, among light rays emitted by O1, light ray O1A is irradiated on an intersection line of the scattering part 212 of the two lamp cover units 21, the projection point on the intersection line is A, and it is only when the light O1A further passes through the AB segment that reaches point B on the scattering part 212 of the right lamp cover unit 21. The light brightness (or intensity) is largely consumed in the AB segment light path, and consequently becomes extremely weak even if the light ray O1A can enter the right lamp cover unit 21. Using O1A as the boundary line, if the dispersion angle in the light rays emitted by the light-emitting point O1 is relatively large and even if the light rays beneath O1A can enter the right lamp cover unit 21, their brightness is also extremely weak. On the other hand, if the dispersion angle is relatively small and the light rays above O1A (e.g., O1C and O1D) are all incident on the scattering part 212 of their own lamp cover unit 21 and propagate out, they will not enter the right lamp cover unit 21. Therefore, the light rays emitted by the right LED lamp 21 will propagate from their own lamp cover unit 21, and will not cause interference towards the adjacent LED pixel units. Moreover, no black areas are present in the space between two adjacent LED pixel units, which improves the pixel filling coefficient and makes the space between LED pixels a "zero distance" and in turn makes the LED screen softer and clearer.

Referring back to FIG. 9, for the above-described scattering part 212, its inner surface is a surface facing towards the LED lamp 11, and the outer surface is a surface facing away from the LED lamp 11. The outer surface of the above-described scattering part 212 has an arched structure facing towards in a direction away from the LED lamp 11.

The arched structure of the scattering part 212 can be implemented in different ways. In some implementations, the outer surface of the scattering part 212 is a spherical surface, e.g., a positive spherical surface or an ellipsoid. In some implementations, the outer surface is an arc surface, e.g., a hyperboloid or a paraboloid, or several planes are joined to form the arched structure. The scattering part 212 can be a solid body structure or a shell-shaped structure. In some implementations, the scattering part 212 includes a positive ball top solid body or shell, oval ball top solid body or shell, or a structure where several flat surfaces are joined to form a quasi-ball top structure or an uneven structure.

For purpose of illustration, the present embodiment uses a scattering part 212 whose outer surface is a positive spherical surface as shown in FIGS. 1-7 and 9. To provide a more detailed explanation of the structure of the lamp cover unit 21, a person skilled in this field can apply the technical scheme provided in the present embodiment to a lamp cover unit with another shape, or make modifications and apply them to a lamp cover unit with another shape.

In some implementations, the scattering part 212 has a positive spherical surface, and its spherical surface radius R can be determined based on dimensions of the LED pixel unit. If an LED lamp 11 is a square structure when viewed from above and a period of the LED pixel unit is a, the spherical surface radius R can be $\sqrt{2}a/2$ to 0.9a. The period of the LED pixel unit is defined as a distance between light-emitting points of two adjacent LED lamps 11, e.g., a distance between O1 and O2 in FIG. 9. When a scattering part 212 with a positive spherical surface is employed, its outer surface can be continuous, round, and smooth, which can not only avoid light ray interference between adjacent pixel units but also improve the filling coefficient. For the structure shown in FIG. 9, since the top surface of the lamp cover unit 21 is a positive spherical surface, the light rays are dispersed in all directions after they propagate from the light cover unit 21, and consequently the brightness decay under conditions of a relatively large viewing angle is not significant.

Figure 10:
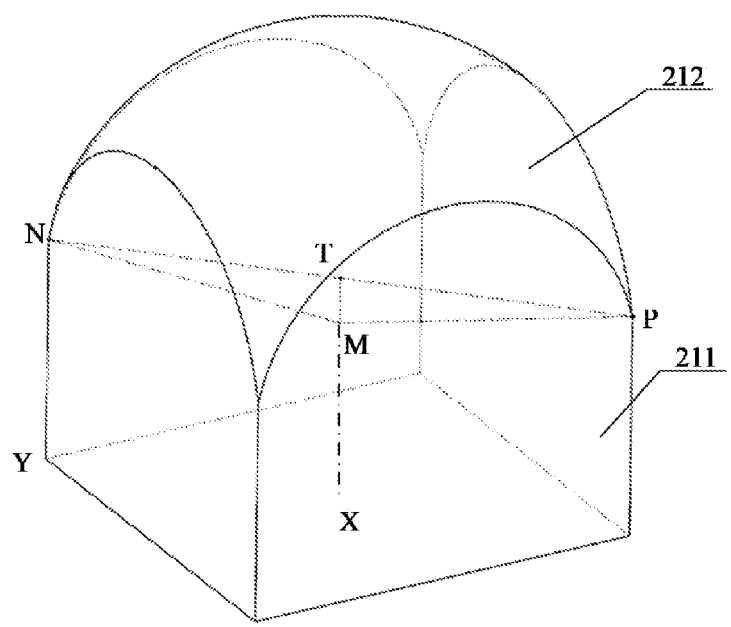
FIG. 10 is a schematic diagram of a spherical center position in which an outer surface of a scattering part of the lamp cover unit in the LED display screen cover is a positive spherical surface.
Figure 11:
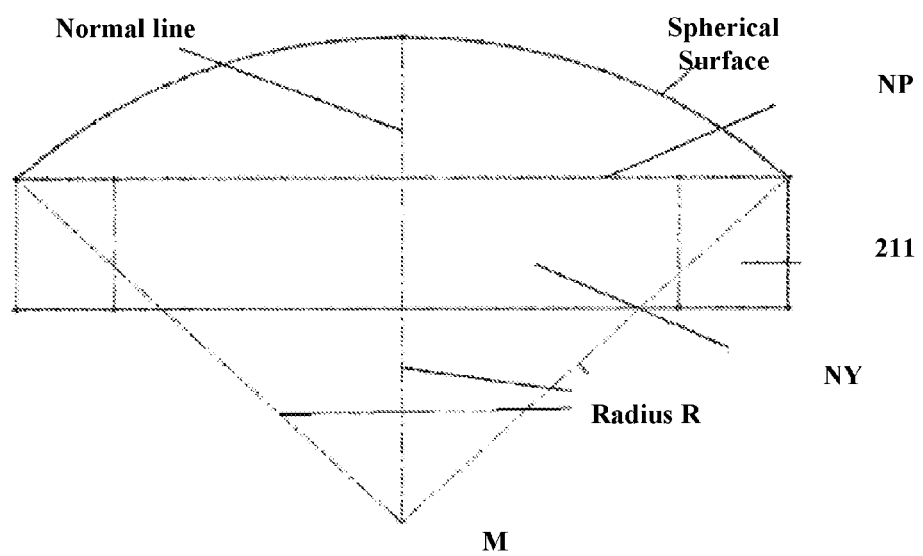
FIG. 11 is a planar view of the spherical-shaped lamp cover unit of FIG. 10.

FIG. 10 is a schematic diagram of a spherical center position in which the outer surface of the lamp cover unit scattering part in the LED display screen cover is a positive spherical surface. FIG. 11 is a planar view of the spherical-shaped lamp cover unit of FIG. 10. Point N and point P are intersection points of the intersection line of two adjacent lamp cover units 21 and two relative edges in the light blocking part 211. A line segment MP is parallel to the PCB circuit board and also parallel to the bottom surface of the light blocking part 211. A line segment NY is a distance from point N to the bottom surface of the light blocking part 211, and it is also the height of the light blocking part 211. The length LNY of line segment NY can be 0.45a-0.7a, and a is the period of the LED pixel unit. The spherical center M of the outer surface of the scattering part 212 is within the plane of the NP line segment and the location of the projection of the NP segment on the PCB circuit board, and is located on the central perpendicular line segment TX of the NP segment (i.e., the central normal line of the LED pixel unit). On the central perpendicular line segment TX, the length of line segment TX is equal to the length LNY of the line segment NY, that is, 0.45a-0.7a, and the length LMT of line segment MT is:

$$L_{MT} = \sqrt{R^2 - \frac{1}{2}a^2}$$

where R is the spherical surface radius of the outer surface of the scattering part 212, and a is the period of the LED pixel unit. A distance between the spherical center M of the outer surface of the scattering part 212 and the bottom surface of the light blocking part 211 is equal to the length $L_{MX}$ of the line segment MX, which is the difference between the length of the above-described line segment TX and the length of line segment MT.

In addition to possessing the above-described functions and advantages, the scattering part 212 also possesses the function of carrying out scattering for the light rays emitting from the LED lamp 11 to make the light rays that emit from the scattering point no longer irritating to the eye, and the extent of its scattering is called the haze. In some implementations, a scattering film is pasted on the outer surface of the scattering part 212. The scattering film can cause the scattering part 212 to have a haze larger than 50%, preferably larger than 70%. In some implementations, a material possessing a fixed haze is used to make the scattering part 212. The material can cause the scattering part 212 to have a haze larger than 50%, preferably larger than 70%.

The above-described light blocking part 211 can also have a fixed haze, and if the light blocking part 211 and scattering part 2212 integrally constitute the lamp cover unit 21, it is possible to use a material with a fixed haze to make the entire lamp cover unit 21. The light rays propagate from the lamp cover unit 21 and will be dispersed in every direction, and the light source seen by the naked eye is the entire lamp cover unit 21 with light emerging, and in this way the point light source is expanded to the surface of the entire lamp cover unit 21. When viewed from the outside of the LED display screen cover, the entire LED display screen cover is lit up, and one cannot see the shape of the LED lamps 11, and this can eliminate the graininess of the LED display screen cover.

Further, if the lamp cover unit 21 is made by employing materials with a fixed haze, it is specifically possible to make it by using materials whose haze is larger than 50%, and preferably larger than 70%, which possesses relatively good visual effects.

In some implementations, the above-described spherical surface radius of the outer surface of the scattering part of the lamp cover unit 21 is set based on the light emission position of the LED lamp 11, the distribution of the light scattering angle of the LED lamp 11, and the haze of the lamp cover unit 21.

Further improvements of the structure of the lamp cover unit 21 can be carried out. In some implementations, when the scattering part 212 in the lamp cover unit 21 is a real solid structure, it is possible to provide a groove that faces in the direction away from the LED lamp 11 from the inner surface of the scattering part 212, and thereby provide a gap used for light dispersion between the inner surface of the scattering part 212 and the upper surface of the LED lamp 11. The cross section of the groove can be rectangular, round, oval, etc., and said cross section is the surface on which the LED lamp 11 is provided parallel to the screen body 1.

Figure 12:
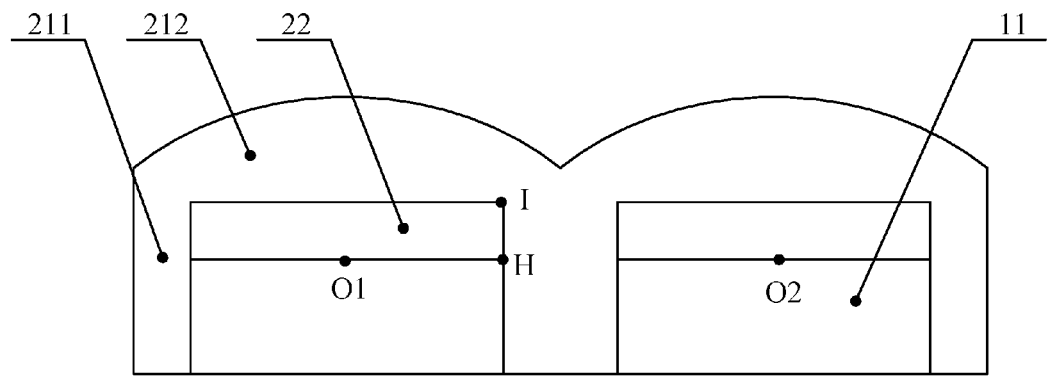
FIG. 12 is a cross-sectional view of two adjacent lamp cover units in another example LED display screen cover.

FIG. 12 is a cross-sectional view of two adjacent lamp cover units in the LED display screen cover. A gap that is used for light dispersion is provided in the space between the inner surface of the scattering part 212 and the upper surface of the LED lamp 11. Specifically, a groove 11 that is rectangular in cross section is provided in the space between the upper surface of the LED lamp 11 and the inner surface of the scattering part 212, and the groove 22 forms a gap in the space between the inner surface of the scattering part 212 and the upper surface of the LED lamp 11. The length and breadth of the groove 22 matches the dimensions of the LED lamp 11, and the depth HI of the groove 22 can be determined based on the sealing dimensions of the LED lamp 11, the circumstances of the welding spots and light angle distribution characteristics, and the optical characteristics of the materials used to make the scattering part 212. The depth HI of the groove 22 can be 0.35b to 0.8b, wherein b is the side length of the LED lamp 11. In a particular example, the depth HI is within a range of 0 to 0.5 mm.

The groove 22 provides a space for placing the LED lamp 11, and the groove 22 can also be used to carry out dispersion and mixing three primary color light rays (e.g., red, green, blue) emitted by the LED lamp 11 before they enter the lamp cover unit 21. For example, the LED lamp 11 includes three LED emitters for emitting red, green, blue color light, respectively.

In FIG. 12, the scattering part 212 and light blocking part 211 are an integral structure, and the light blocking part 211 serves as the side wall of the groove 22 and can be used for fixing on the above-described screen body 1 or stuck in the space between adjacent LED lamps 11. The light blocking part 211 plays a role of supporting the scattering part 212, and it can also play the role of position fixing and thereby make one lamp cover unit correspond to one LED lamp 11 for which it is provided as a cover and make the entire screen cover have no movement in relative to the LED lamps 11.

Figure 13:
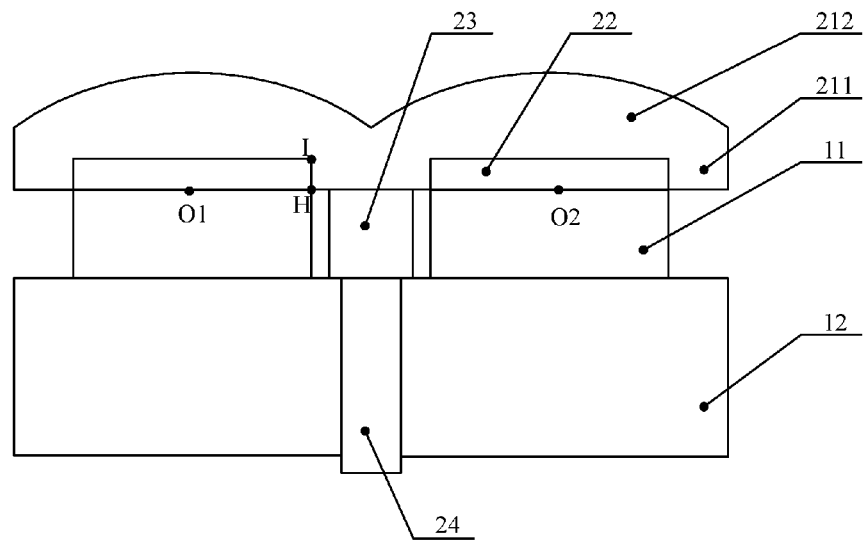
FIG. 13 is a cross-sectional view of two adjacent lamp cover units in another example LED display screen cover.

FIG. 13 is a cross-sectional view of two adjacent lamp cover units in the LED display screen cover provided in another embodiment. As shown in FIG. 13, a first column 23 is provided in the space between the side wall of the groove 22 (or otherwise the light blocking part 211) and the surface of the PCB circuit board 12. The first column 23 is located in the space between two adjacent LED lamps 11, and is used to support the light blocking part 211. The first column 23 can be bonded, bolted or connected with pins on the PCB circuit board 12 to realize the fixing, or through hole created inside the PCB board 12. A second column 24 can be provided inside the through hole, and can be bonded or welded inside the through hole of the PCB board. The second column 24 can be used to support the first column 23. Alternatively, the first column 23 and second column 24 can be an integral structure. In FIG. 13, the first column 23 can be a cylinder or cube, and the second column 24 can be a cylinder or cube. Taking a cylinder as an example, the diameter of the first column 23 is relatively rough, whereas the diameter of the second column 24 is relatively fine and the length is relatively long, and the contact surface with the PCB circuit board 12 is relatively large, and it is used for fixing on the PCB circuit board 12.

On the basis of the above-described technical scheme, another embodiment can be carried out for improvements of the structure of the lamp cover unit 21: the inner surface of the scattering part 212 faces towards the arch in a direction facing away from the LED lamp 11. That is, the inner surface of the scattering part 212 is an arch-like structure or arched structure, and said structure can be a spherical surface, e.g., a positive spherical surface or an ellipsoid; alternatively it is an arc surface, e.g., a hyperboloid, a paraboloid, etc.; or several planes are joined to form the structure of an arch.

Figure 14:
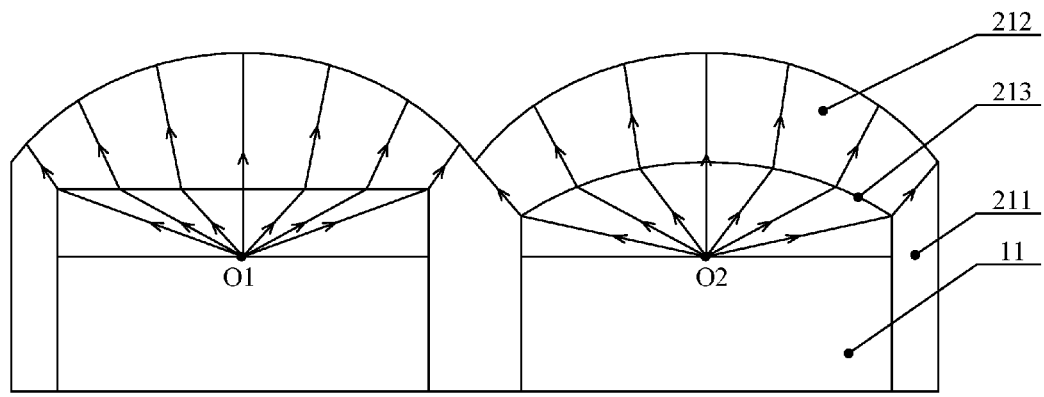
FIG. 14 is a light path schematic comparative diagram in which two lamp cover units in two example LED display screen covers each is fitted with an LED lamp.

FIG. 14 is a light path schematic comparative diagram in which two lamp cover units in the LED display screen cover provided in another embodiment each are fitted with an LED lamp. The inner surface of the scattering part 212 in the right lamp cover unit 21 is an arched or arc surface, while the inner surface of the scattering part 212 in the left lamp cover unit 21 is not an arched structure but rather a plane. For the left structure, the light rays emitted by the LED lamp enter the inside of the scattering part 212 and refraction occurs, and the angle of the refraction is relatively small; the light rays converge towards the center of the scattering part 212, and this may be unfavorable for dispersion of the light rays in all directions, and furthermore this may result in a black side formed on the boundary of the LED pixel unit.

On the other hand, the light rays emitted by the right LED lamp 11 enter the inside of the scattering part 212 and refraction occurs, but owing to the act that the incidence surface is an arched or arc surface, the angle of the refraction is relatively large, the light rays are dispersed in all directions and the occurrence of a black side on the boundary of the LED pixel unit can be avoided. In the lamp cover unit 21 displayed in FIG. 7, the inner surface of the scattering part 212 is a positive spherical surface, and the spherical surface radius r of the inner surface of said scattering part 212 can be obtained by calculating with the following equation:

$$r \geq \sqrt{R^2 - ab + \frac{1}{2}b^2}$$

where R is a spherical surface radius of the outer surface of the scattering part 212, a is the period of the LED pixel unit, and b is the side length of the LED lamp 11.

In some implementations, the spherical surface radius r of the inner surface of the scattering part is determined by a haze of a material of the scattering part, and a maximum of the radius r is not smaller than the spherical surface radius R of the outer surface of the scattering part.

Figure 15:
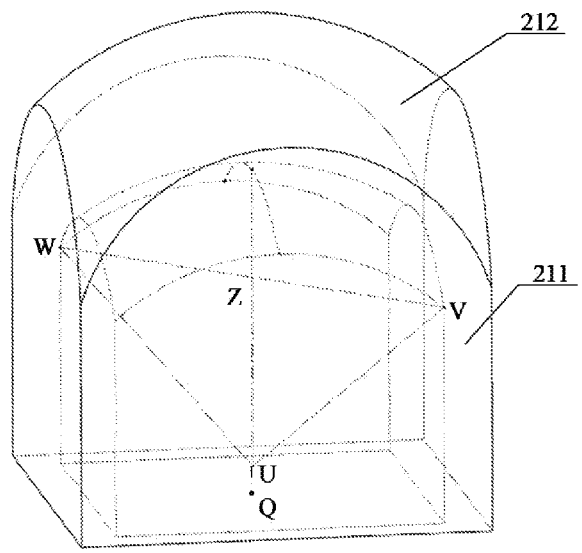
FIG. 15 is a schematic diagram of a spherical center position in which an inner surface of a scattering part of the lamp cover unit in the LED display screen cover is a positive spherical surface.

In addition, for the spherical center position of the inner surface of the scattering part 212, one can refer to FIG. 15. FIG. 15 is a schematic diagram of the spherical center position in which the inner surface of the lamp cover unit scattering part 212 in the LED display screen cover is a positive spherical surface. FIG. 15 shows a perspective view of the lamp cover unit 21, where the boundary of the inside of the lamp cover unit is indicated by the dot-dash line. Point V and point W are respectively the intersection points between the intersection line between the inner surface of the scattering part 212 and the inner surface of the light blocking part 211 and the two relative edges in the light blocking part 211. The line segment VW is parallel to the PCB circuit board 12, and is also parallel to the bottom surface light blocking part 211. The distance between point W and the bottom surface of the light blocking part 211 (that is, the distance $L_{ZQ}$ between the midpoint of the line segment VW and the bottom surface of the light blocking part 211) can be determined based on the height of the LED lamp 11 and the depth HI of the groove 22. The spherical center U of the inner surface of the scattering part 212 is located within the plane of line segment VW and the projection location of line VW on the PCB circuit board 12, and is also located on the central perpendicular line segment ZQ of the VA segment (that is, the central normal line of the LED pixel unit). On the central perpendicular line segment ZQ, the length $L_{UZ}$ of line segment UZ is:

$$L_{UZ} = \sqrt{R^2 - \frac{1}{4}c^2}$$

where R is spherical surface radius of the outer surface of the scattering part 212 and c is the side length of the groove 22. The side length of the groove 22 can be a little bit larger than the side length of the LED lamp 11. The distance $L_{UQ}$ between the spherical center U of the inner surface of the scattering part 212 and the bottom surface of the light blocking part 211 is the difference between the distance $L_{ZQ}$ between the midpoint A and the bottom surface of the light blocking part 211 and the length $L_{UZ}$ of the line segment UZ, that is, $L_{UQ} = L_{ZQ} - L_{UZ}$.

On the basis of the above-described technical scheme, further improvements can be made for the lamp cover unit 21. In some implementations, a transition circular arc is provided in the space between a corner of the inner surface of the scattering part 212 and the inner wall of the light blocking part 211. The cover unit 21 can have the transition circular arcs on all four connection corners between the inner surface of the scattering part 212 and the inner wall of the light blocking part 211.

Figure 16:
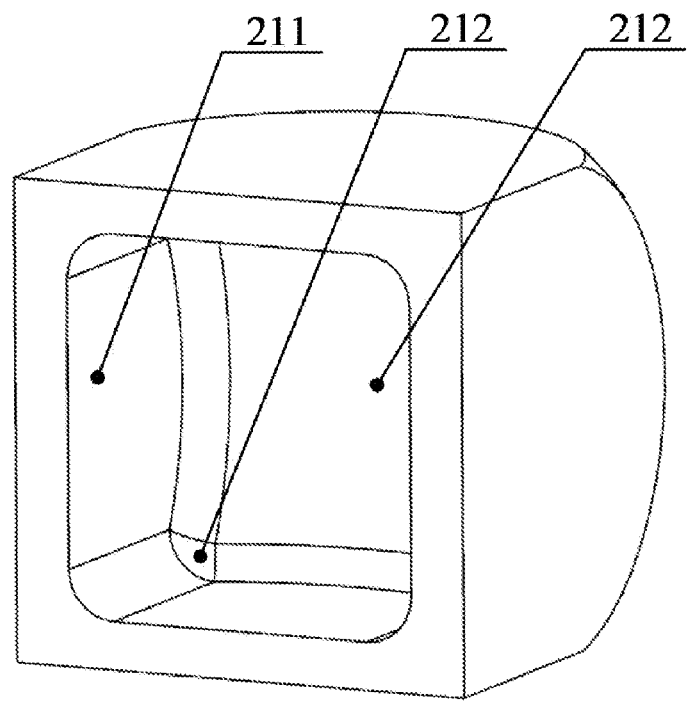
FIG. 16 is a structural schematic diagram of the lamp cover unit in the LED display screen cover is fitted with an LED lamp.
Figure 17:
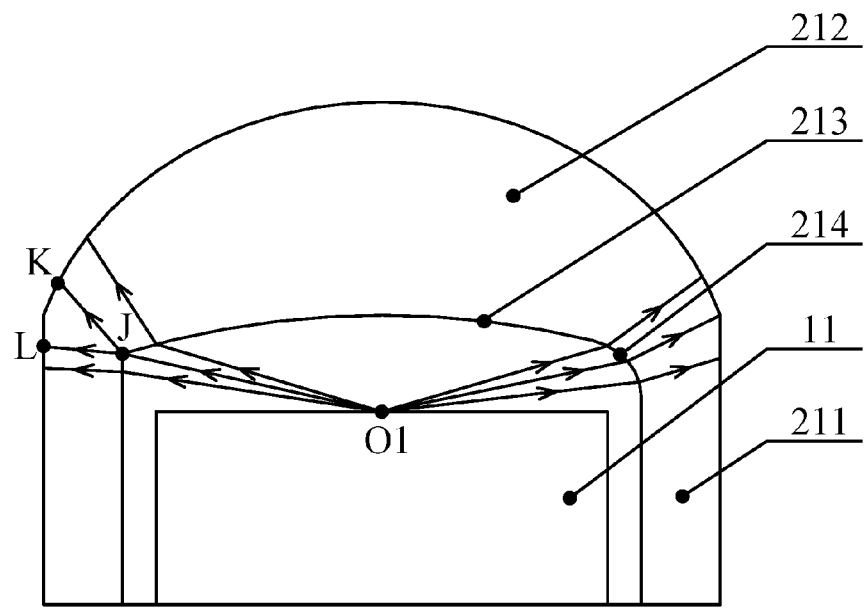
FIG. 17 is a light path schematic diagram in which the LED display screen cover is fitted to an LED lamp.

FIG. 16 is a structural schematic diagram of the lamp cover unit in the LED display screen cover provided in another embodiment is fitted with an LED lamp, and FIG. 17 is a light path schematic diagram in which the LED display screen cover is fitted to an LED lamp. In order to undertake a more detailed description of the above-described technical scheme, the view angle of FIG. 17 is a cross-sectional view that is opened along the diagonal of the LED lamp, and what is displayed on the right side of FIG. 17 is that a transitional arc 214 is provided in the space between the corner of the inner surface of the scattering part 212 and the inner wall of the light blocking part 211, and what is displayed on the left side thereof is that no such transitional arc 214 has been provided in the space between the corner of the inner surface of the scattering part 212 facing the LED lamp and the inner wall of the light blocking part 211, and this is just for the sake of comparison.

As FIG. 17 shows, no transitional circular arc is set up between the inner surface of the scattering part 212 on the left side and the inner wall of the light blocking part 211. J is the conjunction point of the inner surface of the scattering part 212 and the inner wall of the light blocking part 211. Some of the light from the LED lamp 11 is projected to the point J where it is reflected toward JK and JL. So a black area appears at the conjunction point of the outer surface of the scattering part 212 and the outer wall of the light blocking part 211. That is, a black area appears, e.g., between K and L, around the top part of the LED lamp.

A transitional circular arc is set up between the inner surface of the scattering part 212 on the right side and the inner wall of the light blocking part 211. The light from the LED lamp 11 is refracted by the transitional circular arc to evenly reach the conjunction point of the outer surface of the scattering part 212 and the outer wall of the light blocking part 211. No black area appears at the conjunction point. That is, no black area appears around the top corner of the LED lamp. In the same way, the light from LED lamp 11 evenly reaches the whole surface of the scattering part 212 and completely gets rid of the black area on the top corner of the LED pixel unit. A radius of the transitional circular arc can be determined in accordance with the sizes of the scattering part 212, the light blocking part 211, and the LED lamp. In some examples, the radius of the transitional circular arc is from 0.08a to 0.2a, where a is the period of LED pixel unit.

The color of the LED display screen cover itself is an important specification because it can shift the overall color of images displayed by the LED display screen toward the color of the LED display screen cover. For example, if the color of the LED display screen cover is red, then the overall color of images is shifted toward red. In some implementations, to avoid the impact of the color of the LED display screen cover itself on the overall color of images, dark-colored materials are selected for manufacturing the LED display screen cover. In some examples, materials of a grayscale value from 0 to 125 are selected, and the RGB (red:green:blue) ratio is about (1±0.2):(1±0.2):(1±0.2). In a particular example, the ratio is 1:1:1.

The RGB ratio can be determined based on color cards that are commonly used in this industry. For example, Ral Plastics color card provides the following colors: RA1 1000-P, RA1 1011-P, RA1 1020-P, RA14007-P, RA1 5003-P, RA1 5011-P, RA1 6003-P, RA1 6009-P, RA1 7001-P, RA1 7004-P, RA1 7011-P, RA1 7012-P, RA1 7015-P, RA1 7016-P, RA1 7021-P, RA1 7024-P, RA1 7031-P, RA1 7037-P, RA1 8014-P, RA18017-P, RA1 8025-P, and RA1 9011-P. The above-referenced colors are not fixed. Other colors can be also selected.

The LED display screen cover used for the LED display screen includes an array of lamp cover units over the LED display screen. Each lamp cover unit is placed above a respective LED lamp, and the top of the lamp cover unit is an arched structure facing away from the LED lamp. In such a way, light from each LED lamp can only go out through the respective lamp cover unit above, and won't affect adjacent LED pixel units. Also the arched structures of the lamp cover units can uniformly diffuse or scatter the light emitted by the LED lamps to a size of the physical area occupied by the LED pixel units, and the filling coefficient can be greater than 93%. This mechanism makes the images displayed by the LED display clearer. No perceptible black area appears between two adjacent LED pixel units. Therefore, periodic black area grid structures will be eliminated from the entire LED display screen, which makes "no gap" between two adjacent LED pixel units or very small gaps such that it is impossible to form interference fringes. Images become softer and are free from a grainy look.

Figure 19:
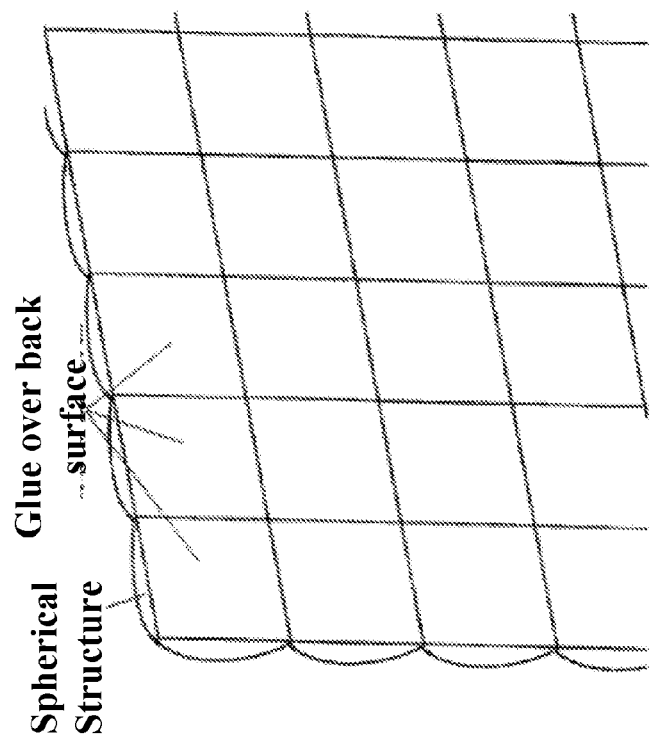
FIG. 19 is a schematic diagram of glue over a back surface of an example LED display screen lamp without light blocking parts.
Figure 18:
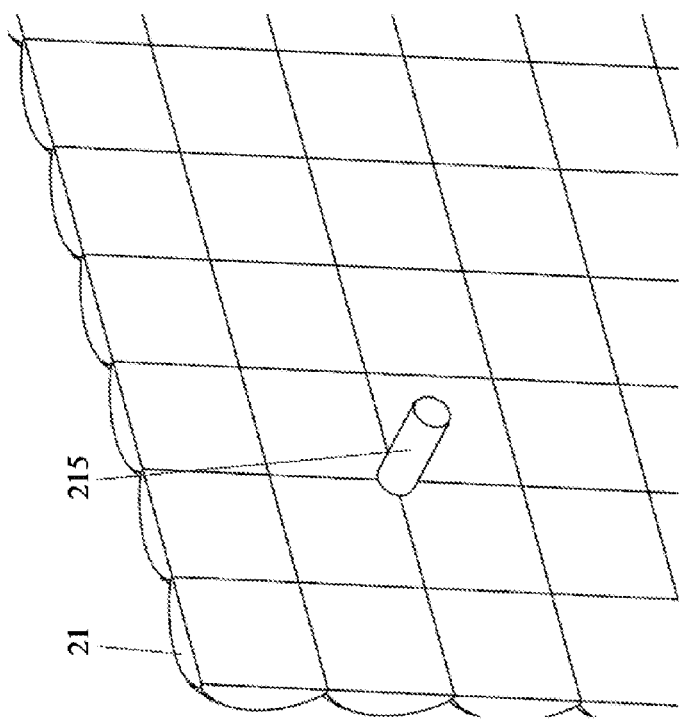
FIG. 18 is a structural schematic diagram of an example LED display screen cover without light blocking parts installed with fixing pins.

FIG. 18 is a structural illustration of another implementation of the LED screen cover. The lamp cover unit 21 has the above referenced scattering part 212, but no light blocking part 211. The top of the lamp cover unit 21 is a structure that arches away from the LED lamp. The details of how to design the arched structure are described above. As FIG. 18 shows, the lamp cover unit 21 does not have a light blocking part 211, so the lamp cover units 21 and the PCB circuit board can be screwed or pinned together, e.g., by at least one fixing pin 215. The lamp cover units 21 and the PCB circuit board can be also glued together. As shown in FIG. 19, a fixed connection between them is achieved by direct bonding on the surface of the LED screen by glue on the back side of the lamp cover units 21.

FIG. 1 shows another implementation of an LED display screen. This implementation includes the LED display screen body 1 that has an array of LED pixel lamps and the LED display screen cover 2 that includes a plurality of lamp cover units 21 and is connected to the screen body 1. The number of the lamp cover units 21 and the number of the LED lamps 11 can be the same. The size of the LED display screen cover 2 corresponds to the size of the LED screen body 1. The plurality of lamp cover units 21 of the LED display screen cover can be integrally formed into a whole piece. In some examples, if an LED display screen has 192×192 LED lamps and if an LED display screen cover has 32×16 cover units, then 6×12 pieces of LED display screen covers are needed to cover the LED display screen.

There are multiple methods to connect the LED display screen cover 2 and screen body 1.

Figure 20:
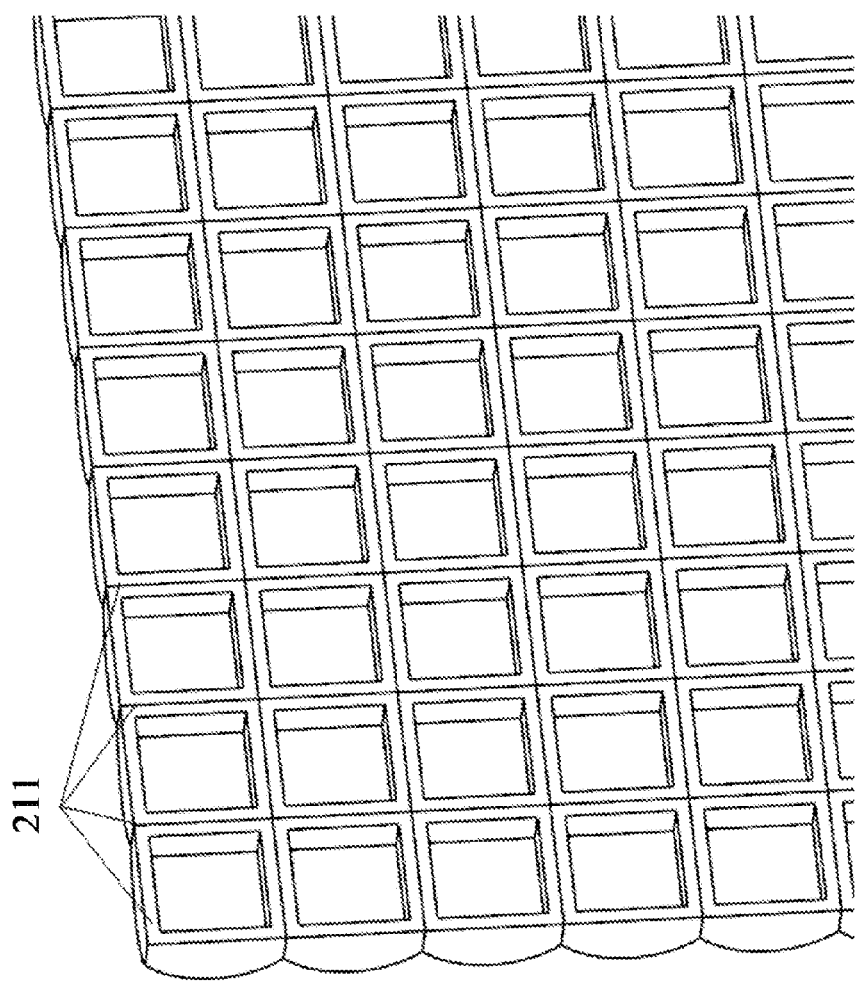
FIG. 20 is a schematic diagram of positions of glue on light blocking parts of an example LED display screen lamp.

One of the methods is to glue them together. FIG. 20 shows a schematic diagram of places for applying glue for the implementations method. Glue is applied to an end of the light blocking part 211 in the LED display screen cover so that it can be connected to the PCB circuit board of the LED screen body 1 between two adjacent LED lamps. Each lamp cover unit is placed above a respective LED lamp.

Figure 21:
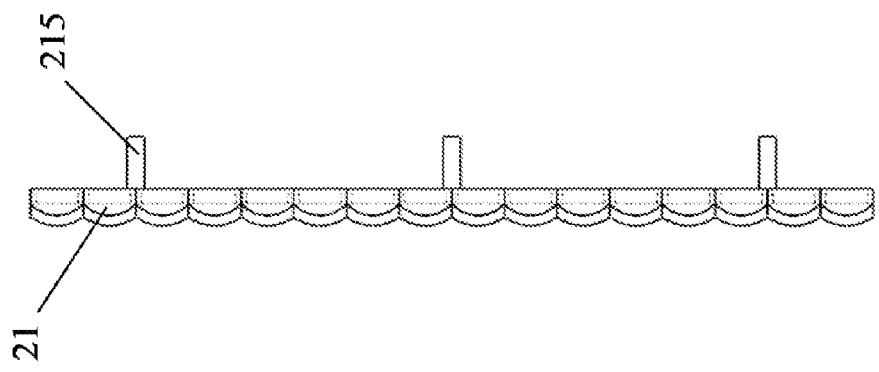
FIG. 21 is a structural schematic diagram of an example LED display screen cover with light blocking parts installed with fixing pins.

Another implementations method is to pin them together. FIG. 21 shows places for applying pins. At least one fixing pin 215 is set up on the surface of the screen cover that faces the LED lamps. Correspondingly, the PCB circuit board of the screen body 1 has a pin hole. The LED display screen cover 2 and screen body 1 are connected when the fixing pin 215 is inserted into the pin hole of the PCB circuit board.

Implementations of the present disclosure also provides methods of manufacturing LED displays or LED display screens with the following steps:

1) a light-permeable material having a haze greater than 50% (or greater than 70%) is selected to manufacture the LED display screen cover. Plastic injection technology can be applied.

2) the LED display screen body is manufactured. An array of LED pixel lamps is arranged on a substrate (e.g., PCB circuit board) to form the LED display screen body. In some examples, each LED pixel lamp is a packaged lamp including three emitters emitting three primary colors (red, green and blue). In some examples, the LED display screen body is formed by directly placing three emitters on the center of each LED pixel on the substrate without packaging (or assembling). The LED display screen cover can be configured to cover the three emitters for each LED pixel.

3) the LED display screen cover and the LED display screen body are installed together by at least one of the methods:

I) pinning them together. The LED display screen cover manufactured in step 1) is placed in front of the LED display screen body manufactured in step 2). Fixing pin 215 is inserted into the pin hole on the PCB circuit board. Heat is used to melt the pin end sticking out on the back side of the PCB circuit board. After the pin end cools off, the screen cover and the screen body are fixed together, or II) gluing them together. Glue can be directly to the back side or the light blocking part of the LED display screen cover. Then the LED display screen cover is pressed on the surface of the LED display screen body.

In a particular example, for P2.5 LED display screen body, its pixel period is 2.5 mm. The package size of the LED display screen body is 2 mm×2 mm×0.7 mm. The thickness of the PCB circuit board is 2 mm. The resolution of the LED display screen body is 80×32. That is, there are 80×32 LED lamps on a PCB circuit board. The manufacturing of the LED display screen can include the following steps:

Step 1: production of the LED display screen cover. Polycarbonate (PC) injection molding is used, and one LED display screen cover is made into 16×16, that is, it can cover 16×16 LED pixel lamps. The polycarbonate material haze is 95%. When a black master batch with a thickness smaller than 1 mm is added, the light permeability of the material becomes 50%. The LED display screen cover period is 2.5 mm; the spherical surface radius of the spherical surface scattering part in the lamp cover unit is designed to be 2.06 mm; the groove 22 has a length and a breadth that are both 2 mm+0.1 mm (positive allowance), and a depth that is 0.7 mm+0.05 mm (positive allowance); for the groove bottom, based on the circumstances, it is possible to make a spherical arc-shaped depression structure (that is, a structure in which the inner surface inside the above-described scattering part 212 is an arc surface). In the present embodiment the arc surface radius is 3 mm and the arc surface depth is 0.2 mm; the fixing pin is a cylinder with dimensions of Φ 0.7 mm-0.5 mm (negative allowance)×2.3 mm. One LED screen body requires 5×2 LED screen covers.

Step 2: production of the LED screen body. It can be produced according to general LED screen production methods. To install 5×2 scattering covers on the LED screen body, through holes Φ 0.7 mm+0.5 mm (positive allowance) are created respectively in the corresponding positions.

Step 3: installation. The injection molded LED display screen covers are covered on the front end of the LED screen body according to a mode of 5×2, and the fixing pins pass through the through holes on the printed circuit board (PCB). The fixing pins that are passed through the back side of the PCB are heated to make them melt, and after they cool they are remolded such that the scattering cover is fixedly installed on the LED screen body.

In such a way, the production of one LED screen body with LED display screen covers is completed. After that, several LED screen bodies installed with LED display screen covers may be connected according to installation and production process of ordinary LED large screens to achieve a larger LED display screen.

Alternatively, in the above-described step 3, the LED display screen covers can be fixed to the LED screen body by applying glue to the back side of the LED display screen covers. After the glue has been applied to the entire flat surface of the back side of the LED display screen covers, the LED display screen covers may be directly covered on the surface of the LED screen body and bonding may be done.

A number of embodiments of the invention have been described. Nevertheless, it will be understood that various modifications may be made without departing from the spirit and scope of the invention. For example, screen covers described here can be also used in liquid crystal displays (LCDs) or other image or video display systems. Light sources of the display systems can be LED lamps, lasers, semiconductor diodes, or any suitable light sources. Accordingly, other embodiments are within the scope of the following claims.

What is claimed is:

1. A screen cover comprising:
a screen cover body including a plurality of cover units disposed in an array of multiple rows and multiple columns, each cover unit configured to be positioned over a respective LED lamp of an array of LED pixel units of an LED screen,
wherein a top of each cover unit forms an arched structure extending away from the LED lamp, and
wherein the arched structures of adjacent cover units are configured and joined along the columns and rows so as to provide the screen cover with a filling coefficient of more than 93%.

2. The screen cover of claim 1, wherein the screen cover body has a haze of no less than 50%.

3. The screen cover of claim 1, wherein each cover unit comprises:
a light blocking part configured to block off light from adjacent LED pixel units; and
a scattering part installed on top of the light blocking part and forming the top of the cover unit.

4. The screen cover of claim 3, wherein an outer surface of the scattering part is spherical.

5. The screen cover of claim 4, wherein a spherical radius of the outer surface of the scattering part is within a range of $\sqrt{2}a/2 \sim 0.9a$, where a is a period of the LED pixel units.

6. The screen cover of claim 1, wherein an inner surface of each cover unit is positioned so as to form a gap between the inner surface and an upper surface of the LED lamp.

7. The screen cover of claim 6, wherein the inner surface is arched away from the LED lamp.

8. The screen cover of claim 7, wherein the inner surface is spherical.

9. The screen cover of claim 8, wherein an outer surface of the scattering part is spherical, and the inner surface has a radius r determined by:

$$r \geq \sqrt{R^2 - ab + \frac{1}{2}b^2}$$

where R is a radius of the outer surface, a is a period of the LED pixel units, and b is an edge length of the LED lamp.

10. The screen cover of claim 8, wherein a transitional circular arc is formed between the spherical inner surface and an adjacent inner wall of the screen cover.

11. The screen cover of claim 10, wherein a radius of the transitional circular arc is within a range of 0.08 a-0.2 a, where a is a period of the LED pixel units.

12. The screen cover of claim 1, comprises a material having an RGB color ratio of about (1±0.2):(1±0.2):(1±0.2).

13. A screen cover comprising:
a screen cover body including a plurality of cover units disposed in an array of multiple rows and multiple columns, each cover unit configured to be positioned on top of a respective LED lamp of an array of LED pixel units of an LED screen,
wherein a top of each cover unit forms an arched structure extending away from the LED pixel lamp, the arched structures of adjacent cover units being configured and joined along the columns and rows such that, when placed over an illuminated LED screen, no perceptible light gaps are visible between adjacent screen pixels, as viewed through the screen cover body.

14. The screen cover of claim 13, configured to have a filling coefficient of more than 93%.

15. The screen cover of claim 13, wherein the cover unit comprises a light blocking part configured to block off light from adjacent LED pixel units and a scattering part installed on top of the light blocking part and forming the top of the cover unit.

16. The screen cover of claim 15, wherein an inner surface of the scattering part is a spherical surface, and a transitional circular arc is provided between the inner surface and an inner wall of the light blocking part.

17. A covered LED screen, comprising:
an array of LED pixel units arranged in multiple rows and multiple columns; and
a screen cover body with an array of LED cover units disposed in multiple rows and multiple columns, each cover unit configured to be positioned over an LED lamp of a respective one of the LED pixel units;
wherein an outer surface of each cover unit is convex, the outer surfaces of adjacent cover units being configured and joined along the columns and rows, and
wherein each cover unit has an inner surface spaced from an outer surface of an underlying LED lamp to form a gap.

18. The covered LED screen of claim 17, wherein the inner surface of each cover unit is concave.

19. The covered LED screen of claim 18, wherein each concave inner surface transitions to adjacent side walls of a cavity of the cover unit containing the respective LED lamp by a transitional radius.

20. The covered LED screen of claim 17, wherein the outer convex surfaces of adjacent cover units are configured and joined so as to provide the screen cover with a filling coefficient of more than 93%.

* * * * *